United States Patent
Okahata

(10) Patent No.: US 9,484,473 B2
(45) Date of Patent: Nov. 1, 2016

(54) ANTI-REFLECTION GLASS SUBSTRATE

(71) Applicant: ASAHI GLASS COMPANY, LIMITED, Chiyoda-ku (JP)

(72) Inventor: Naoki Okahata, Tokyo (JP)

(73) Assignee: ASAHI GLASS COMPANY, LIMITED, Chiyoda-ku (JP)

(*) Notice: Subject to any disclaimer, the term of this patent is extended or adjusted under 35 U.S.C. 154(b) by 68 days.

(21) Appl. No.: 14/054,054

(22) Filed: Oct. 15, 2013

(65) Prior Publication Data

US 2014/0246084 A1    Sep. 4, 2014

Related U.S. Application Data

(63) Continuation of application No. PCT/JP2012/060180, filed on Apr. 13, 2012.

(30) Foreign Application Priority Data

Apr. 15, 2011  (JP) ................. 2011-091436
Apr. 27, 2011  (JP) ................. 2011-099983

(51) Int. Cl.
*C03C 17/22* (2006.01)
*H01L 31/0216* (2014.01)
(Continued)

(52) U.S. Cl.
CPC ......... *H01L 31/02168* (2013.01); *C03C 15/00* (2013.01); *C03C 17/23* (2013.01); *G02B 1/118* (2013.01); *C03C 2204/08* (2013.01)

(58) Field of Classification Search
CPC ........ C09D 5/006; G02B 1/11; G02B 1/113; G02B 1/115; G02B 1/118; G02B 1/12; H01L 31/02168; C03C 15/00; C03C 17/00; C03C 17/02; C03C 17/22; C03C 17/23; C03C 2204/08; Y10T 428/24355; Y10T 428/24364
See application file for complete search history.

(56) References Cited

U.S. PATENT DOCUMENTS

4,731,558 A * 3/1988 Haisma et al. ............... 313/478
4,833,001 A   5/1989 Kijima et al.
(Continued)

FOREIGN PATENT DOCUMENTS

CN    87 1 08379 A    7/1988
CN    101679109 A     3/2010
(Continued)

OTHER PUBLICATIONS

Extended Search Report issued Oct. 1, 2014 in European Patent Application No. 12771074.4.
(Continued)

*Primary Examiner* — Nancy Johnson
(74) *Attorney, Agent, or Firm* — Oblon, McClelland, Maier & Neustadt, L.L.P.

(57) ABSTRACT

A glass substrate of which at least one surface multiple concave and convex portions. Rp representing the size of the convex portion is 37 nm to 200 nm; a tilt angle θp indicating a maximum frequency in the frequency distribution of a tilt angle θ of the convex portion is 20° to 75°; and an absolute value of a difference between θp and $θ_{50}$ ($θp-θ_{50}$) is 30° or less, where $θ_{50}$ indicates a value showing 50% of a cumulative frequency distribution of the tilt angle θ. The concave and convex portion is such that the surface roughness (Ra) is 2 nm to 100 nm, the maximum height difference (P–V) is 35 nm to 400 nm, and the area ratio (S-ratio) is 1.1 to 3.0.

20 Claims, 3 Drawing Sheets

(51) Int. Cl.
  *C03C 15/00*  (2006.01)
  *C03C 17/23*  (2006.01)
  *G02B 1/118*  (2015.01)

(56) References Cited

U.S. PATENT DOCUMENTS

| | | |
|---|---|---|
| 5,087,481 A | 2/1992 | Chen et al. |
| 2002/0014090 A1* | 2/2002 | Tsujino et al. ............... 65/17.2 |
| 2003/0011315 A1* | 1/2003 | Ito et al. .................... 315/169.3 |
| 2003/0170459 A1 | 9/2003 | Lin |
| 2010/0089096 A1 | 4/2010 | Tamitsuji et al. |
| 2010/0180939 A1* | 7/2010 | Sharma ............... C03C 15/00 136/256 |

FOREIGN PATENT DOCUMENTS

| | | |
|---|---|---|
| JP | 64-037718 | 2/1989 |
| JP | 04-251437 | 9/1992 |
| JP | 04-265513 | 9/1992 |
| WO | 2008/156176 | 12/2008 |
| WO | 2008/156177 | 12/2008 |

OTHER PUBLICATIONS

Ciprian Iliescu, et al., "Characterization of masking layers for deep wet etching of glass in an improved HF/HCl solution", Surface & Coatings Technology, vol. 198, No. 1-3, XP27608369, 2005, pp. 314-318.

International Search Report issued Jun. 26, 2012 in PCT/JP2012/060180 filed Apr. 13, 2012.

* cited by examiner

ANTI-REFLECTION GLASS SUBSTRATE

TECHNICAL FIELD

The present invention relates to an anti-reflection glass substrate having a layer of which the glass portion has been unleveled and of which the refractive index is lower than that of glass (hereinafter this may be referred to as "low-refractivity layer").

BACKGROUND ART

Heretofore, for glass substrates for use in applications that require light transmission therethrough, such as glass for building materials, glass for automobiles, glass for displays, optical elements, glass substrates for solar cells, glass for shop windows, optical glass, lenses for glasses, etc., there is a case of forming an anti-reflection film on the surface of the glass substrate for increasing the light transmittance. For example, for obtaining high-permeability glass members, an anti-reflection film has heretofore been formed with a fluoride film such as an $MgF_2$ or a hollow $SiO_2$ film on the surface of the member according to a method of dry coating such as vapor deposition, sputtering or the like, or a method of wet coating such as spreading, spin coating or the like.

However, the functional film differing in property from the glass substrate is formed, which is, therefore, problematic in that the adhesiveness between the glass substrate and the functional film is poor and the film may readily peel by the operation such as wiping. Accordingly, a method of bringing a fluorinating agent into contact with the surface of a glass substrate to thereby form a porous structure on the surface of glass (hereinafter this may be referred to as "etching"), thereby forming an anti-reflection film thereon, is known (Patent Documents 1 to 3).

This may be presumed to be as follows: on the glass surface, the fluorine compound could react with $SiO_2$ which forms the network structure of glass, to thereby form $SiF_4$ (gas), and as a result, the remaining part that has lost the network could be a silicofluoride to form the porous region on the surface.

The above-mentioned Patent Document 1 mentions, as the fluorinating agent, a fluorine elemental substance ($F_2$) or a fluorine compound capable of forming a bond between a fluorine atom and a metal atom by cutting the bond between the oxygen atom and the metal atom in the glass network, for example, hydrogen fluoride (HF), silicon tetrafluoride, phosphorus pentafluoride, phosphorus trifluoride, boron trifluoride, nitrogen trifluoride, chlorine trifluoride, and mentions that, among these, the fluorine elemental substance is most preferred as highly reactive as it is and capable of shortening the reaction time. Regarding the concentration of the fluorinating agent, the document describes that, in a case where the concentration is too low, then the reaction speed is low and the treatment time is long, but in a case where the concentration is too high, then the reaction speed is high and the reaction control is difficult, and further describes that, by raising the temperature of the gaseous fluorinating agent and/or by increasing the pressure thereof, the fluorine atom concentration on the glass surface can be increased; and concretely, for forming the porous structure, a fluorine elemental substance is used as the fluorinating agent, and in a case where the $F_2$ concentration is 20 mol %, then the surface treatment is carried out at from 20 to 80° C. for from 1 to 8 hours, and in a case where the $F_2$ concentration is 2 mol %, then the surface treatment is carried out at from 550 to 600° C. for 15 minutes.

Patent Document 2 describes that, by controlling the hydrogen fluoride concentration on the glass surface to be 1 mol % or less, the surface of glass can be subjected to fluorination treatment with excellent adhesiveness at low cost, without worsening the surface properties owing to any excessive etching effect, and also describes that, for controlling the hydrogen fluoride concentration to be 1 mol % or less, hydrogen fluoride is not used as the fluorinating agent. In Patent Document 3, a glass substrate is surface-treated at from 10° C. to 60° C., using a gas that contains hydrogen fluoride and water.

PRIOR ART DOCUMENTS

Patent Document

Patent Document 1: WO 08/156177
Patent Document 2: WO 08/156176
Patent Document 3: JP-A-4-251437

SUMMARY OF INVENTION

Technical Problem

The technique of bringing a fluorinating agent into contact with the surface of a glass substrate to thereby form a porous structure (unleveled structure) on the surface, thereby providing a low-refractivity layer having a refractive index lower than that of glass is known; however, the anti-reflection performance is still low even though etching is performed under various controls as above, and it is still desired to realize a glass substrate having a high anti-reflection performance.

In a case where the anti-reflection glass substrate is used as the substrate of a thin-film silicon solar cell, the power generation layer used in the thin-film silicon solar cell has wavelength dependence such that the light falling within a specific wavelength range increases the power generation efficiency, and especially, since the amorphous silicon layer efficiently absorbs the light of from 400 to 700 nm of sunlight, it is desired to realize an anti-reflection glass substrate improved in point of the transmittance in that wavelength range.

Solution to Problem

Given the situation, the present inventors have made various investigations and, as a result, have reached the present invention. That is, the present invention includes the following constitutions.

(1) A glass substrate of which at least one surface has been unleveled in a glass portion thereof and has multiple concave and convex portions, wherein in a frequency distribution in a case where the multiple concave and convex portions are subjected to approximation through two-dimensional Fourier transformation and then each convex portion of the multiple concave and convex portions is approximated to a regular quadrangular pyramid and a length of one side of a base thereof is considered as a size of the convex portion:

in a case where Rp indicates a maximum frequency, the Rp representing the size of the convex portion is from 37 nm to 200 nm;

a tilt angle θp indicating a maximum frequency in the frequency distribution of a tilt angle θ of the convex portion is from 20° to 75°; and in a case where $\theta_{50}$ indicates a value showing 50% of a cumulative frequency distribution of the tilt angle $\theta$, an absolute value of a difference between $\theta p$ and $\theta_{50}$ ($\theta p-\theta_{50}$) is 30° or less, and the concave and convex portion is such that a surface roughness (Ra) thereof, as defined in JIS B 0601 (1994), is from 2 nm to 100 nm, a maximum height difference (P–V) thereof is from 35 nm to 400 nm, and an area ratio (S-ratio) thereof, as calculated by dividing an area containing the concave and convex portion by an inspection area, is from 1.1 to 3.0.

(2) The glass substrate according to (1), wherein an atomic number concentration ratio of F/Si in the surface of the glass substrate, which has been unleveled, in a range to a depth of 5 nm is 0.05 or more.

(3) The glass substrate according to (2), wherein the F/Si continuously decreases from the surface to an inside thereof in a depth direction.

(4) The glass substrate according to any one of (1) to (3), wherein, in a case where a normal line vertical to a glass surface before being subjected to an unleveling treatment is drawn from an interface between the glass surface of the glass substrate, which has been unleveled, and air, there is at least one normal line which passes through one or more air layers existing on a glass substrate side with respect to the glass substrate surface before being subjected to the unleveling treatment other than an air layer on an upper surface of the glass substrate (provided that in a case where any additional such normal line can be drawn within a range of from a position of 25 nm on the left of that normal line to a position of 25 nm on the right of that normal line, all those lines are counted as the same normal line), within a range of 1000 nm in a width direction of the glass substrate.

(5) The glass substrate according to any one of (1) to (4), wherein a relative specific surface area (specific surface area of the glass substrate after having been subjected to an unleveling treatment to a specific surface area of an untreated glass substrate), based on a specific surface area as measured according to a BET adsorption method using krypton gas, is from 1.1 to 5.0.

(6) The glass substrate according to any one of (1) to (5), wherein a region of at least 50% of the glass surface which has been unleveled is coated with a film comprising $SiO_2$ as a main component.

(7) The glass substrate according to any one of (1) to (6), wherein the glass surface which has been unleveled is coated with a film comprising $SiO_2$ as a main component to an inside of the concave portion.

Advantageous Effects of Invention

According to the present invention, a glass substrate having anti-reflection performance of 1.0% or more with respect to the unleveled surface in a broad wavelength range of from 400 to 1100 nm can be obtained. In addition, the transmittance in a wavelength range can be improved by 1.0% or more, and the glass substrate is expected to greatly improve the cell efficiency of the amorphous silicon layer in a thin-film silicon solar cell.

The present inventors have found through AFM image analysis of the glass substrate on which the concave and convex portions are formed that, when "the concave portions are deep", or that is, in a case where the length R of the convex portions is from 37 nm to 200 nm and the tilt angle $\theta$ of the convex portions is from 20° to 75°, then the anti-reflection effect is greatly increased.

DESCRIPTION OF EMBODIMENTS

Figure 1:
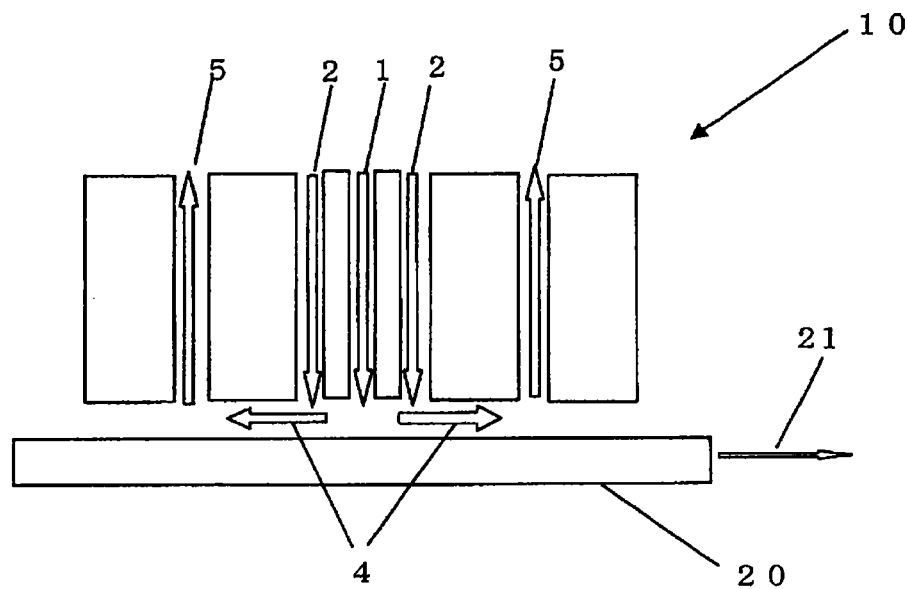
FIG. 1 is a conceptual view of the apparatus used in Examples.

The present invention is described in detail hereinunder.
<Glass Substrate>

The glass substrate for use in the present invention is not always required to be flat and in the form of plates but may also be a curved one or may have an irregular shape, and for example, the glass substrate may be so-called figured glass that has, on the surface thereof, a forming roller surface pattern given during glass forming. As the glass substrate, usable examples thereof include colorless transparent soda lime silicate glass, aluminosilicate glass, borate glass, lithium aluminosilicate glass, quartz glass, borosilicate glass substrates, alkali-free glass substrates, and other transparent glass substrates of any other types of glass.

In a case where the glass substrate is used for a substrate for solar cells, the thickness of the glass substrate is preferably from 0.2 to 6.0 mm. Within the range, the strength of the glass substrate is high and the transmittance thereof is high. Also preferably, the substrate has a high transmittance in a wavelength range of from 350 to 800 nm, for example, preferably having a transmittance of 80% or more. Further, it is desirable that the glass substrate has insulation property and has high chemical and physical durability.

In the present invention, a porous structure is formed on the surface of the glass substrate so that the refractive index of the glass substrate surface becomes lower than the refractive index of bulk glass and a "low-refractivity layer" having a lowered refractive index than glass can be formed. For increasing the anti-reflection effect by forming an unleveled structure on a glass surface, it is necessary that the refractive index (mixed refractive index) of the two materials composed of the convex portions formed of glass material and air that occupies the spaces of the concave portions is lower than the refractive index of glass. A schematic view of the unleveled structure is exemplified in FIG. 2. In the present invention, the unleveled structure means a structure having a multiple concave and convex profile composed of multiple concave and convex portions.

For the "depth of the concave portion", the depth can be measured from a cross-section SEM image. In the present invention, however, the convex portion is approximated to a regular quadrangular pyramid and the length of one side of the base thereof is represented by Rp; on the cross-sectional view of the convex portion, the convex portion is approximated to an isosceles triangle and the tilt angle $\theta p$ is measured; and the depth is represented by those data. The length R of one side represents the size of the convex portion, or in other words, represents the width of the opening of the concave portion. Regarding the size R of the convex portion as approximated in the manner as above, the maximum frequency in the frequency distribution of the size is considered to represent the size Rp of the convex portion. The length Rp of one side of the convex portion is preferably from 37 nm to 200 nm. In a case where the length is smaller than 37 nm, then the unleveled structure becomes extremely fine and the concave portions become shallow and therefore the glass substrate could hardly attain a sufficient anti-reflection effect; and in a case where the length is larger than 200 nm, then the unleveled structure becomes extremely coarse and the concave portions become extremely deep and therefore the glass substrate is vulnerable to external force and could not have sufficient abrasion resistance. More preferably, the length is from 37 nm to 180 nm, even more preferably from 40 nm to 150 nm, still more preferably from 60 nm to 130 nm.

The tilt angle θp indicates the height of the convex portion along with Rp, or that is, indicates the depth of the concave portion, and indicates a tilt angle θ in the maximum frequency in the frequency distribution of the tilt angle θ. The tilt angle θp is preferably from 20° to 75°. In a case where the angle is smaller than 20°, then the tilt of the unleveled structure becomes gentle and the concave portions become shallow and therefore the glass substrate could hardly attain a sufficient anti-reflection effect; and in a case where the angle is larger than 75°, then the tilt of the unleveled structure becomes extremely steep and therefore the glass substrate is vulnerable to external force and could not have sufficient abrasion resistance. More preferably, θp is from 20° to 70°, even more preferably from 25° to 70°.

In a case where $\theta_{50}$ indicates a value showing 50% of the cumulative frequency distribution of the tilt angle θ, the absolute value of the difference between θp and $\theta_{50}$ (θp−$\theta_{50}$) is preferably 30° or less. In a case where (θp−$\theta_{50}$) is more than 30°, then the height of the convex portions of the unleveled structure and the depth of the concave portions thereof are not uniform and such is undesirable since the in-plane uniformity of the anti-reflection effect of the glass substrate having the unleveled structure worsens. The absolute value of (θp−$\theta_{50}$) is more preferably 20° or less, and is even more preferably 13° or less.

Figure 3:
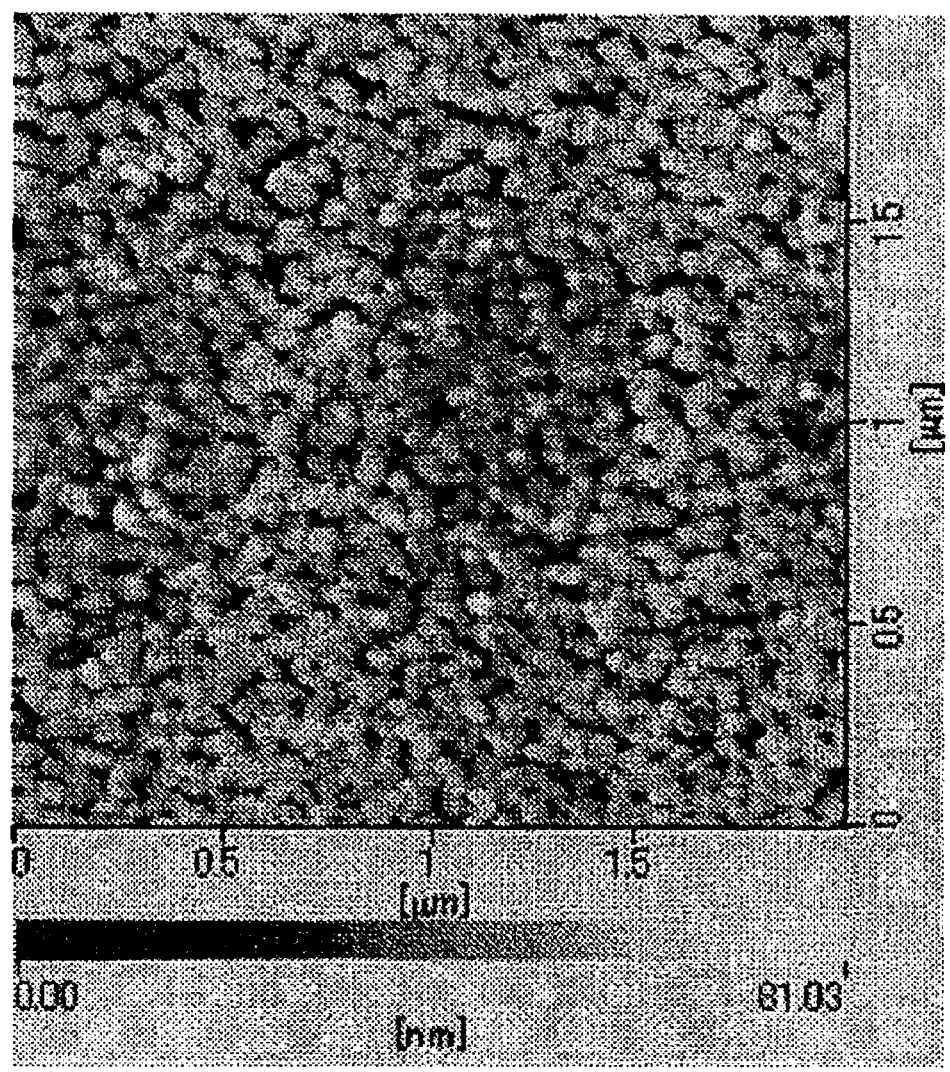
FIG. 3 is an AFM image of the glass substrate obtained in Example 1.

To form a porous structure (unleveled structure) on the surface of a glass substrate means that the surface of the glass substrate has a large number of pores (open pores) formed thereon, indicating that multiple concave and convex portions exist as shown in FIG. 3 (AFM image). For forming a low-refractivity layer on the surface of a glass substrate, it is desirable that the surface roughness (Ra) of the glass substrate, as defined in JIS B 0601 (1994), in the surface profile observed through AFM is from 2 nm to 100 nm. In a case where the surface roughness is less than 2 nm, then the anti-reflection effect is insufficient; and in a case where the surface roughness is more than 100 nm, then the surface of the glass substrate is too much unleveled and therefore the abrasion resistance thereof greatly lowers. More preferably, Ra is from 2 nm to 70 nm, even more preferably from 2 to 50 nm. P−V (maximum height difference) in the surface profile thereof observed through AFM is preferably from 35 nm to 400 nm, more preferably from 35 to 350 nm, even more preferably from 35 to 200 nm. P−V (maximum height difference) has the same meaning as the definition of Rz in JIS B 0601 (2001). S-ratio (the area ratio as calculated by dividing the area containing the concave and convex portions by the inspection area) in the surface profile, as observed through AFM, is preferably from 1.1 to 3.0. In a case where the ratio is less than 1.1, then the area increase ratio relative to the original glass substrate is less than 10% and therefore the unleveled structure could not be said to be formed sufficiently, and such is unfavorable since the anti-reflection effect of the glass substrate is thereby small. On the other hand, in a case where the ratio is more than 3.0, then the anti-reflection effect is sufficient, but the size R of the convex portions of the unleveled structure is extremely small and the tilt angle θ is extremely large and, in addition, since the glass substrate has such a property that its brittleness is extremely high as compared with metal, the abrasion resistance of the surface is extremely small, and such a case is unfavorable. S-ratio is more preferably from 1.1 to 2.7, even more preferably from 1.1 to 2.5.

According to the specific surface area measurement method using krypton gas in a BED adsorption method, the profile of the concave portions spreading inside the concave portion can be measured more accurately than the S-ratio to be obtained from AFM, and the relative specific surface area (specific surface area of the glass substrate after having been subjected to the unleveling treatment to the specific surface area of the untreated glass substrate), based on the specific surface are as measured according to the specific surface area measurement method, is preferably from 1.1 to 5.0, more preferably from 1.1 to 3.0.

The value t (nm) of the depth of the unleveled structure of the glass substrate having the unleveled structure, as obtained from the cross-section electrophotographic microscopic image, is preferably from 30 nm to 400 nm. The depth d is a mean value of the data measured at any given three points on the cross-section electrophotographic microscopic image taken at a magnification of 100,000 times. More preferably, the value t is from 30 to 350 nm, even more preferably from 30 to 300 nm.

The profile of the concave portions spreads inside the concave portion, therefore increasing the anti-reflection effect. "Spreading inside the concave portion" means that, in a case where a normal line vertical to the glass surface is drawn from the glass/air interface on the glass surface having the convex and concave portions, the normal line has one or more air layers existing on the glass substrate side with respect to the untreated glass substrate surface, other than the air layer on the upper surface of the glass substrate.

Concretely, the above means that, in the cross-sectional profile obtained by tracing the unleveled profile on the cross-section SEM image obtained by observing the glass substrate at a magnification of 100,000 times (see FIG. 5), in a case where a line (normal line k) vertical to the original glass/air interface is drawn, the cross-sectional profile has a profile such that the normal line k passes through one or more air layers m other than the air layer on the upper surface of the glass substrate, on the glass substrate side with respect to the glass substrate surface s which has not been subjected to HF treatment (to be mentioned below); or that is, the above means that the cross-sectional profile has the profile having one or more air layers to be partitioned by the normal line k, on the glass substrate side with respect to the untreated glass substrate surface. Here the untreated glass substrate surface s indicates the surface position of glass before the unleveling treatment (etching). In this case, in a case where one normal line is considered to be a base line and any additional such normal line can be drawn within a range of a position of 25 nm on the left of that normal line to a position of 25 nm on the right of that normal line, then all those lines are counted as the same normal line. In a case where the glass substrate is in the form of a plate, the back surface of the substrate in the form of a plate is parallel to the untreated glass substrate surface s, since one surface of the substrate in the form of a plate is unleveled to thereby form the unleveled structure, and thus, the normal line may be drawn vertically to the back surface of the substrate in the form of a plate.

As in the above, in a case where at least one surface of the glass substrate has the unleveled structure having at least one, preferably at least three normal lines k which passes through at least one air layer on the glass substrate side with respect to the untreated glass substrate surface, other than the air layer existing on the upper surface of the glass substrate, in a range of 1000 nm in the width direction, then the excellent anti-reflection effect can be obtained. The glass/air interface means, in the cross-sectional profile obtained by tracing the cross-section SEM image, the position of the linear line as drawn to be such that the area of the mountain and the valley to be formed by the line sequentially connecting the adjacent convex portions could be the same area. The glass surface before etching is a different surface, but it is considered that the glass surface s and the glass/air interface could be parallel to each other. Consequently, in a case where the glass before etching has a constant thickness and the etching is performed only on the glass surface thereof, the case could be the same as the case where the back of the glass is taken as the basis.

According to the present invention, the glass substrate having a high anti-reflection effect such that the mean transmittance thereof in a range of from 400 nm to 1100 nm is increased by 1.0% or more, even by 1.5% or more, as compared with that of the untreated glass substrate can be obtained. In addition, the glass substrate is in a state having a fine unleveled structure formed thereon, and therefore, the glass substrate that has been hydrophilic before the unleveling treatment can be more hydrophilic, and the glass substrate that has been water-repellent before the unleveling treatment can be more water-repellent.

Preferably, the glass substrate in the present invention is a glass substrate that contains an alkali element or an alkaline earth element or aluminium as the component thereof, and concrete examples thereof include soda lime silicate glass, and aluminosilicate glass. The component of the glass substrate may include zirconium. In a case where the glass substrate contains an alkali metal, an alkaline earth metal or aluminium, the surface thereof may be treated with a gaseous or liquid fluorinating agent that contains a molecule having a fluorine atom existing inside the structure thereof, whereby F may readily remain in the glass outermost layer, and such a case is preferred since the transmittance of the glass substrate can be increased by taking advantage of the low refractivity characteristic of the fluoride.

It is known that an alkali metal, an alkaline earth metal and Al each can form a compound with F. The compound of the element with F has a low refractive index ($n_1$) than glass, and in a case where the compound is formed on the surface of a glass substrate, it acts as a film having an intermediate refractive index between the refractive index ($n_2$) of the glass substrate and the refractive index ($n_0$) of air. Specifically, $n_0<n_1<n_2$. The refractive index of the glass substrate, the fluorine compound film and air is lower in that order, and as a result, the transmittance of the glass substrate which has been treated with a vapor or liquid that contains a molecule having a fluorine atom existing in the structure thereof increases more than the transmittance of the untreated glass substrate, and therefore the treated glass substrate is preferred as the glass substrate for the present invention.

Preferably, the surface atomic number concentration ratio (F/Si) of the glass substrate with a low-refractivity layer formed thereon is preferably 0.05 or more. Here, the atomic number concentration in the surface means the concentration within a range of from the glass surface to a depth of 5 nm. In general, it is known that many fluorides are low-refractivity compounds. For example, examples thereof include crystalline compounds such as NaF, KF, $MgF_2$ and $CaF_2$. Examples thereof further include amorphous compounds having a composition similar to that of NaF, KF, $MgF_2$, $CaF_2$, etc. Additionally, examples thereof further include crystalline compounds and amorphous compounds, which contain two or more elements and F, such as typically $Na_3AlF_6$, to which, however, the present invention is not limited. In a case where F/Si is less than 0.05, then the low-refractivity layer could not be formed sufficiently and, as a result, the sufficient anti-reflection effect could not be obtained, which is unfavorable. More preferably, F/Si is 0.1 or more, even more preferably 0.15 or more.

In the present invention, the low-refractivity layer can be formed by surface treatment of the surface of glass at a high temperature with a fluorinating agent. The fluorinating agent is a substance that contains a fluorine atom as a part of the chemical structure thereof and can cut the bond between the oxygen atom and the metal atom in the network of an oxide glass and form a bond between the fluorine atom and the metal atom, or a substance that contains a fluorine atom as a part of the chemical structure thereof as a result of decomposition by, for example, heat or the like, and can cut the bond between the oxygen atom and the metal atom in the network of a glass substrate and form a bond between the fluorine atom and the metal atom.

As the fluorinating agent, examples thereof include a fluorine compound capable of cutting the bond between the oxygen atom and the metal atom in the network of a glass substrate and forming a bond between the fluorine atom and the metal atom. Concrete examples thereof include a fluorine elemental substance ($F_2$), hydrogen fluoride (HF), hydrofluoric acid, trifluoroacetic acid, silicon tetrafluoride ($SiF_4$), phosphorus pentafluoride ($PF_5$), phosphorus trifluoride ($PF_3$), boron trifluoride ($BF_3$), nitrogen trifluoride ($NF_3$) and chlorine trifluoride ($ClF_3$). However, the present invention is not limited to those vapors or liquids. In a case where a liquid substance thereof is used, the liquid may be directly applied to the surface of a glass substrate as it is according to a surface treatment method of spraying or the like, or after the liquid is gasified, the resulting gas may be applied to the surface of a glass substrate. If desired, the substance may be diluted with any other liquid such as water, or with any other vapor such as nitrogen. The fluorinating agent may be used either singly or in a combination thereof. Of the above-mentioned fluorinating agents, preferred are hydrogen fluoride and hydrofluoric acid as having high reactivity with the surface of the glass substrate. Hydrogen fluoride is preferred from the viewpoint that glass being conveyed at high speed can be treated with within a short period of time and therefore the productivity is extremely high.

The fluorine compound for use in the present invention may contain any other liquid or vapor than itself, preferably a liquid or vapor not reacting with the fluorine compound at a room temperature. Examples thereof include $N_2$, air, $H_2$, $O_2$, Ne, Xe, $CO_2$, Ar, He, Kr, etc., to which, however, the present invention is not limited. Two or more kinds thereof may be used in a combination. As the carrier for the fluorine compound or for those prepared by diluting the fluorine compound, an inert gas such as $N_2$ and argon is preferably used.

$SO_2$ may be mixed in the fluorine compound for use in the present invention. $SO_2$ is used in continuous production of glass substrates according to a floating method or the like, and has an effect of preventing glass from being damaged in annealing where conveyor rollers are kept in contact with glass substrates. In addition, the compound may further contain a gas capable of decomposing at a high temperature.

Further, water vapor or water may be mixed in the fluorine compound. In a case where HF is used as the fluorine compound, the molar ratio of water to HF ([water]/[HF]) is preferably 10 or less. It is considered that, in a case where water is made to exist in HF, then a hydrogen bond may be formed between the HF molecule and the water molecule so that HF that acts on a glass substrate could be reduced. In a case where the [water]/[HF] is more than 10, then the amount of HF capable of acting on glass would be extremely small and, as a result, the increase in the mean transmittance at from 400 nm to 1100 nm would be less than 1.0% as compared with the case of the untreated glass substrate. More preferably, the [water]/[HF] is 5 or less from the viewpoint that the amount of HF capable of acting on a glass substrate does not decrease. The method of spraying an HF gas-containing vapor onto glass is more preferred. In particular, the method of spraying an HF gas-containing vapor onto glass from a gas-spraying apparatus referred to as an injector used in a CVD method is preferred, since the in-plane distribution on the treated surface could be made uniform with ease.

In a case where an HF gas-containing vapor is sprayed onto a glass substrate, the temperature of the glass substrate is preferably 400° C. or more. The upper limit of the glass substrate temperature varies depending on the glass transition temperature (Tg) of the glass substrate, and is therefore preferably Tg+60° C. More preferably, the upper limit is Tg+40° C.

Through the treatment of the glass substrate surface with the above-mentioned fluorinating agent, a fluorine atom is introduced into bulk glass and a low-refractivity layer having lower refractive index than the untreated glass is formed on the bulk glass surface, thereby giving a glass substrate of which the mean transmittance in a range of from 400 nm to 1100 nm is increased by 1.0% or more, even by 1.5% or more, as compared with the case of the untreated glass substrate and of which the anti-reflection effect is thereby increased. In addition, it is possible to obtain a glass substrate with a fluorine atom introduced into the glass substrate surface, which is hardly contaminated with fingerprints.

Preferably, the glass substrate of the present invention is such that the F/Si therein continuously decreases from the glass surface toward the inside in the depth direction. Existence of a fluorine atom only in the outermost surface of the glass substrate makes it possible to form a low-refractivity layer; however, in a case where the ratio continuously decreased toward the inside in the depth direction, the low-refractivity substance is broadly distributed in the bulk thickness direction and therefore the low-refractivity layer of which the refractive index continuously varies could be thick, and as a result, the embodiment is preferred as having a further enhanced anti-reflection effect rather than the case where a fluorine atom exists only in the glass substrate surface. Continuously decreasing F/Si means that, in a curve drawn by plotting the numerical value obtained by standardizing the F atomic number concentration at each depth in compositional analysis in the depth direction of XPS, with the Si atom concentration at that depth on the Y axis and plotting the depth direction based on the glass substrate surface taken as zero on the X axis, Y monotonically decreases with the increase in the numerical value on the X axis.

The glass substrate of the present invention has sufficient abrasion resistance and weather resistance by itself, but since the surface thereof has a porous structure, the abrasion resistance may lower in some degree in a case where the porous structure is thickened. However, by coating 50% or more of the unleveled glass substrate surface with a film containing $SiO_2$ as a main component, it is possible to further improve the abrasion resistance and the weather resistance.

The film containing $SiO_2$ as a main component may be a film composed of an oxide alone or may additionally contain any other compound such as a nitride, a fluoride, a sulfide, etc. As the oxide film containing $SiO_2$ as a main component, various films containing Na, Mg, Ca, Ti, Al, Sn, Zr or the like are known, and in a case where $SiO_2$ is a main component in the film, any of those elements may be combined with the $SiO_2$. Also an oxide film additionally containing a combination of two or more any elements other than Si may be used. In addition, a film doped with a small amount of a lanthanoid element, an actinoid element or the like may be used.

For improving the abrasion resistance and the weather resistance of the unleveled glass substrate, any film may be selected and used, in which the ingredient other than $SiO_2$ is any other compound; however, since the refractive index of $SiO_2$ is close to the refractive index of the glass substrate, $SiO_2$ is preferred as capable of keeping the anti-reflection effect.

The obtained $SiO_2$ film may be good in a case where $SiO_2$ is contained in an amount of 50% by mass or more; however, the layer formed of a mixture or composite oxide with a compound having a high refractive index has a high refractive index and therefore detracts from the anti-reflection effect attained by the unleveled structure or by fluorine atom introduction. Consequently, the $SiO_2$ content is preferably 70% by mass or more. Containing $SiO_2$ in an amount of 50% by mass or more means that the layer contains $SiO_2$ as a main component. The formed film may be continuous or discontinuous.

Preferably, the unleveled glass substrate surface is coated with the film containing $SiO_2$ as a main component from the viewpoint of improving the abrasion resistance of the unleveled glass substrate. The unleveled glass substrate surface has concave portions and convex portions, in which the ratio of the concave portion to the convex portions is such that they are distributed in the unleveled structure in an amount of almost 50% each. Coating at least all the convex portions with a dense film containing $SiO_2$ as a main component, or that is, coating nearly 50% of the glass surface with the film could make it possible to form a dense and tough layer on the surface of the glass substrate even though the unleveled structure of the glass substrate is deformed in some degree, and therefore in the case, the abrasion resistance of the unleveled glass substrate can be improved. More preferably, 70% or more of the unleveled glass substrate surface is coated with the layer.

It is also desirable to continuously coat even the inside of the concave portions in the unleveled structure with the film containing $SiO_2$ as a main component, for improving the weather resistance of the unleveled glass substrate. In general, in a case where glass substrates are left for long periods in a coast area, the physical properties such as transmittance thereof are noticeably worsened. In the glass substrate having an unleveled structure formed by the use of a fluorinating agent, a fluorine atom has been introduced in the outermost surface of the unleveled structure, and with that, the balance of the other atoms has been broken and the glass composition has been thereby changed; and for example, in a case where salt water is sprayed over the glass substrate for a long period of time, then the surface composition of the substrate is changed owing to the influence of the chlorine atom in the salt water thereon. That is, a phenomenon that the glass substrate is deteriorated occurs. However, in a case where even the inside of the concave portions is completely coated with a film containing $SiO_2$ as a main component and the outermost surface of the unleveled structure is made to be the dense film containing $SiO_2$ as a main component, then the salt water spraying resistance and even the weather resistance can be thereby improved.

The $SiO_2$ portion of the film that contains $SiO_2$ as a main component may be formed, for example, according to a CVD process, or may also be formed by overcoating the glass substrate having the unleveled structure with a liquid capable of forming $SiO_2$; however, the present invention is not limited to these methods. In a case where the film is formed through CVD process, examples of the Si source to be used include $SiH_4$, $SiHCl_3$, $SiH_2Cl_2$, $SiH_3Cl$, $SiCl_4$, $SiBr_4$, $SiI_4$, $SiF_4$, $Si(OC_2H_5)_2$, etc. Examples of the oxidant usable here include $O_2$, $O_3$, NO, $NO_2$, $N_2O$, CO, $CO_2$, etc. However, both the Si source and the oxidant are not limited to these examples. In a case where the film is formed according to the liquid coating method, examples of the Si source to be used include alkoxysilanes such as typically $Si(OC_2H_5)_2$, $Si(OCH_3)_2$, etc.; chlorosilanes such as typically $SiMe_2Cl_2$, $SiPh_2Cl_2$, $SiMe_2EtCl$, etc.; polysiloxanes having a siloxane bond and other various silicone resins; as well as silazanes, polysilazanes, liquid glass, etc. However, the present invention is not limited to any of these. Any combinations of an Si source and an oxidant, which are capable of finally forming $SiO_2$ by the action of oxygen in air, or by the action of light having a specific wavelength such as typically UV or the like, or by the action of heat or the like, are employable here, without limiting to the descriptions given herein. The coating liquid may contain $SiO_2$ particles therein. The $SiO_2$ particles may be hollow particles having a hollow inside the particles, or may be solid particles in which all of the particles component is $SiO_2$, or may also be a mixture prepared by mixing them in any desired ratio. For example, a film may be formed here from a liquid that may form $TiO_2$ after coating therewith and contains $SiO_2$ particles therein, and the film formed through heat treatment and light treatment after coating contains $SiO_2$ particles dispersed in $TiO_2$. A film containing $SiO_2$ as a main component may be formed only in the concave portions in the unleveled structure, thereby giving a glass substrate that has extremely small concave and convex portions on the surface thereof as a whole and has a smooth flat surface as that of the original glass substrate.

Not specifically defined, the thickness of the film containing $SiO_2$ as a main component is preferably 100 nm or less. In a case where the thickness thereof is 100 nm or less, the film can achieve excellent mechanical strength and weather resistance without having any negative influence on the anti-reflection effect.

EXAMPLES

The present invention is described in more detail with reference to the following Examples; however, the present invention is not limited to these Examples.

Example 1

Using a double-flow injector 10 that is used in an atmospheric CVD process, a hydrogen fluoride-containing gas was brought into contact with the surface of a glass substrate (hereinafter this may be simply referred to as "HF treatment"), as in the schematic view of FIG. 1.

That is, as in FIG. 1, a gas prepared by mixing 0.56 SLM (standard liter per minute) of HF and 9 SLM of nitrogen was heated at 150° C., and introduced onto a glass substrate at a flow rate of 64 cm/s through the center slit 1, while 45.5 SLM of $N_2$, also heated at 150° C., was introduced thereonto through the outer slit 2, thereby making the glass substrate having an unleveled structure. The gases run on/above the substrate 20 through the flow path 4, and via the exhaust slit 5, the gases are exhausted in an amount of 2 times the flow amount of the introduced gases. For monitoring the gas temperature and flow rate, a hot-wire anemometer (Climomaster 6543 manufactured by Kanomax Inc.) was used. As the glass substrate, soda lime glass manufactured by Asahi Glass Company Ltd. (thickness 1.8 mm, Tg: 560° C.) was used. The glass substrate was heated at 600° C., and conveyed at a speed of 2 m/min. The temperature of the glass substrate was monitored with a radiation thermometer placed just before gas introducing thereonto. The etching time was about 5 seconds and was short.

The glass substrate treated in the manner as above was ultrasonically washed with pure water for 5 minutes, and then the transmittance, the data of AFM physical properties, the weather resistance and the abrasion resistance thereof were measured in the manner mentioned below. The results are shown in Table 2 and Table 3.

<Transmittance>

Apparatus: Spectrophotometer (Model UV-3100PC manufactured by Shimadzu Corporation)

Light was entered from the treated surface to measure the integrating sphere transmittance. The increase from the transmittance of the untreated glass indicates the anti-reflection effect of the obtained glass substrate. The data are shown here as the mean value in each wavelength range of from 400 to 1100 nm and from 400 to 700 nm.

<Ra, P–V, S-Ratio Through AFM Measurement>

Using a scanning probe microscope (Model SPI 3800N manufactured by SII Nanotechnology Inc.), the obtained glass substrate was inspected in a DFM mode for the inspection layer of 2 μm square with the number of data to be collected of 1024×1024, thereby determining the surface roughness (Ra), the maximum height difference (P–V) and the S-ratio (value calculated by dividing the area containing the concave and convex portions by the inspection area). The surface of the glass substrate obtained in Example 1 is shown in FIG. 3. In the present invention, the maximum height difference (P–V) is the same as Rz (JIS B0601:2001).

<Rp: Size of Convex Portion>

FIG. 2a shows a schematic view of the concave and convex portion of a glass surface. The AFM image of the concave and convex portions was processed through two-dimensional Fourier transformation and the unleveled structure was approximated to a regular quadrangular pyramid (FIG. 2b, FIG. 2c). In the case, the length of one side of the base thereof is considered as the size of the concave/convex portion which is represented by R, and the maximum frequency in the frequency distribution thereof is represented by Rp. In general, the frequency distribution after image processing fluctuates greatly and is therefore unsuitable for data analysis. Consequently, for the frequency at a certain R, the frequency data were measured at the point and additionally at four points before and after that point, therefore totaling 9 points, and the data were averaged to give the frequency value at that point R. As a result, the frequency distribution graph of size R can be smoothed, therefore facilitating the data analysis. Rp indicating the maximum frequency was obtained from the smoothed graph and from the data thereof.

$$F(u, v) = \int_{-\infty}^{\infty} \int_{-\infty}^{\infty} f(x, y)e^{-i2\pi(ux+vy)}dxdy$$

Two-dimensional Fourier transformation is generally represented by the mathematical formula 1. In general, Fourier transformation is a treatment for replacing a temporal space with a frequency space. On a two-dimensional image, the data are subjected to Fourier transformation twice in the longitudinal direction and in the lateral direction thereon, thereby giving a component fraction of the frequency contained in the AFM image signal.

<$\theta p$: Tilt Angle of Convex Portion>

Figure 2:
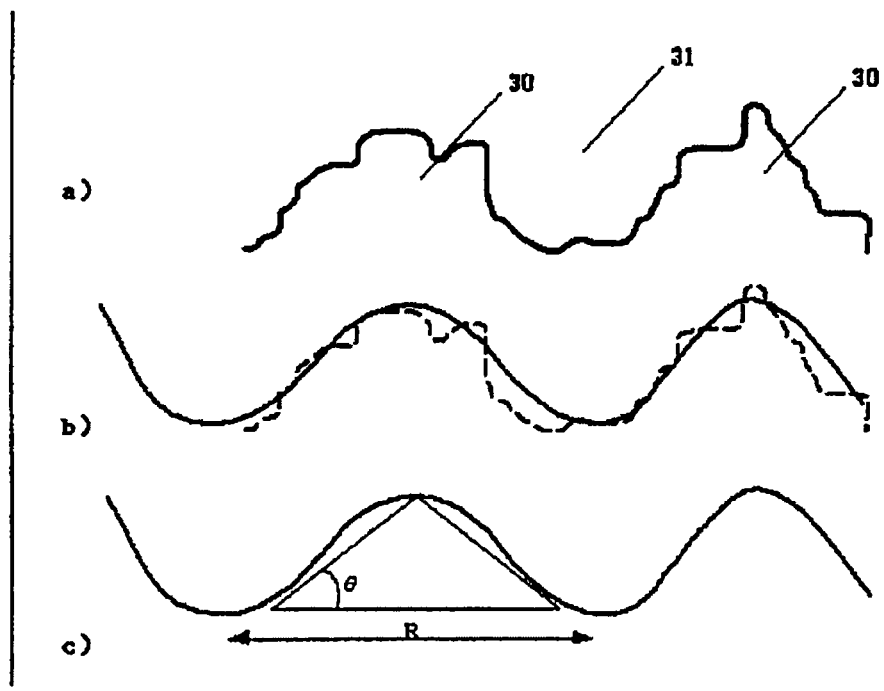
FIG. 2 is a schematic view for explaining the definition of the unleveled profile.

In FIG. 2 showing a schematic view of a glass substrate having an unleveled structure, the AFM image was processed and the unleveled structure was approximated to an isosceles triangle (FIG. 2b, FIG. 2c). In the case, the frequency distribution of the tilt angle $\theta$ was prepared at different angles each at an interval of 2 degrees. In the frequency distribution, an intermediate value of the angles was employed as $\theta p$ for the tilt angle indicating the maximum frequency at an interval of 2 degrees.

<$\theta_{50}$>

The mean value of the tilt angles before and after the frequency distribution curve of a tilt angle $\theta$ passing through 50% of cumulative frequency is represented by $\theta_{50}$. For example, in a case where the cumulative frequency distribution curve passes through 50% of cumulative frequency between an angle distribution of from 28 to 30° and an angle distribution of from 30 to 32° (for instance, in a case where the angle distribution of from 28 to 30° is 47% and the angle distribution of from 30 to 32° is 51%), $\theta_{50}$ is 30°.

<t: Thickness of Unleveled Structure>

Using a cross-section SEM image distance measurement system, the thickness of the unleveled structure part is measured at 3 points, and the data are averaged.

<F/Si>

For the measurement, an X-ray photoelectron spectrometer (XPS, Quantera SXM manufactured by Ulvac-Phi Inc.) was used. The measurement condition in XPS analysis was as follows: As the X-ray source, a monochromatic AlKα ray at 25 W was used. The photoelectron detection area was 100 μmφ). The photoelectron detection angle was 45 degrees. The pass energy was 224 eV. Ar ion was used as the sputtering ion. From the peak intensity of each element detected through XPS analysis, the atomic concentration profile was obtained, which was then standardized with Si concentration. The depth from the surface was calculated from the data measured according to the following method. A thin film having a known thickness and having the same composition as the oxide glass (glass substrate) was formed on an Si substrate for thickness measurement, by a sputtering deposition method, and this was analyzed through XPS analysis according to the same measurement method and the same condition as above. The ratio was obtained from the sputtering rate of the thus-formed thin film as estimated from the compositional profile of the film in the depth direction.

<Weather Resistance>

5% by mass salt solution was sprayed over the treated surface for 2 hours, and thereafter the glass substrate was left in a furnace at 60° C. and 95% RH for 7 days. This was one cycle, and this cycle was repeated four times, followed by washing with pure water, and the transmittance thereof was measured. The measured value was compared with the transmittance before the test. The reduction in the mean transmittance of the tested sample in a wavelength range of from 400 to 700 nm was taken as the weather resistance thereof. The weather resistance indicates the degree of degradation and therefore basically has a negative numerical value. The samples having a larger numerical value have higher weather resistance, while those having a smaller numerical value have smaller weather resistance.

<Abrasion Resistance>

A felt piece (10.3 mm×15 mm×49 mm) was so arranged that the surface of 10.3 mm×49 mm thereof could be kept in contact with the glass substrate. A load of 1 kg was applied thereto, and the felt piece was moved back and forth on the glass substrate at a speed of 10 cm/s. After 100 times repetitive reciprocal movement, the transmittance of the glass substrate was measured and compared with the transmittance thereof before abrasion. The reduction in the mean transmittance in a wavelength range of from 400 to 700 nm was taken as the abrasion resistance thereof. The abrasion resistance indicates the degree of degradation and therefore basically has a negative numerical value. The samples having a larger numerical value have higher abrasion resistance, while those having a smaller numerical value have smaller abrasion resistance.

<Evaluation of Internal Profile of Concave Portion>

Figure 4:
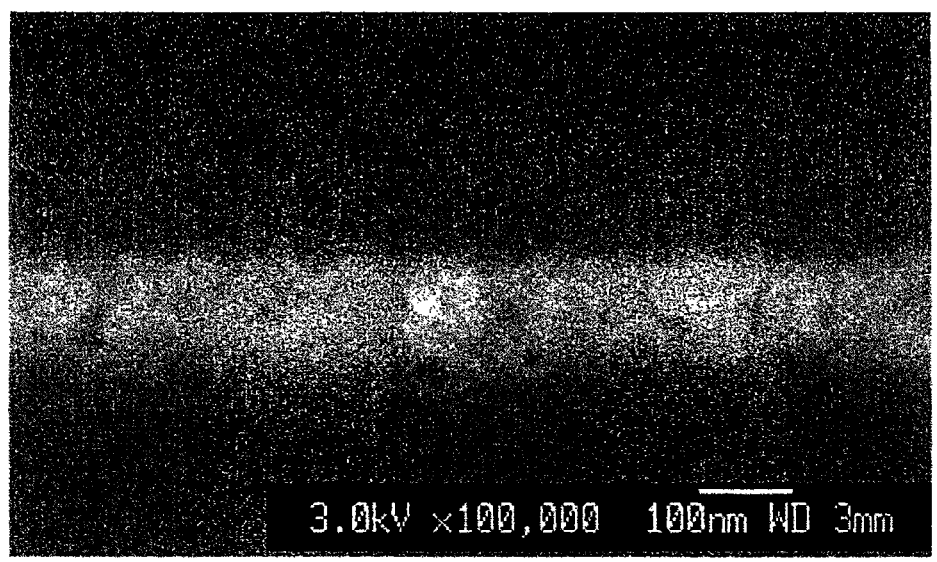
FIG. 4 is a secondary electron image of the cross-section SEM image of the glass substrate obtained in Example 1.

The anti-reflection glass substrate produced in Example 1 was cut vertically to the glass/air interface thereof, and the cross section SEM image thereof was taken and analyzed with ultra-high resolution analytical scanning microscope (SU-70) manufactured by Hitachi Ltd. Using an osmium coater (NL-OPC 60N: manufactured by Nippon Laser and Electronic Lab), the cross section was coated with a 5-nm metal osmium layer to prepare a glass substrate. In the observation, WD was set at 3 mm and the accelerating voltage was set at 3.0 kV to provide a secondary electron image. The obtained image is shown in FIG. 4.

Figure 5:
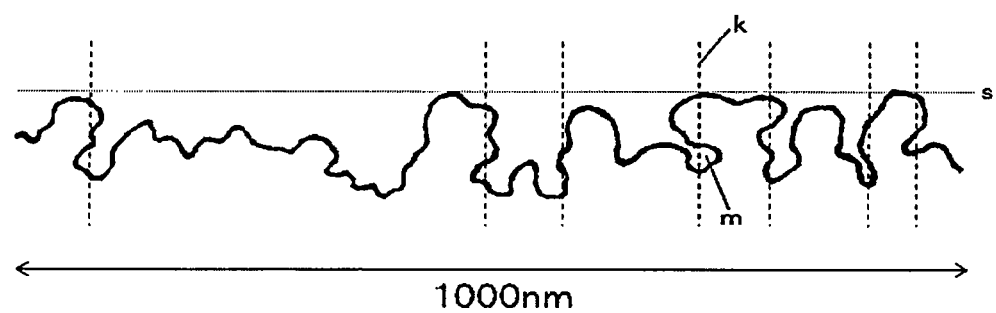
FIG. 5 is a view that traces the unleveled cross-section profile of the electron image obtained in FIG. 4.

Next, the unleveled profile in the cross section part of the secondary electron image was traced onto a separate piece of paper, on which the outline of the outside of the unleveled profile (curved face via which the unleveled surface is kept in contact with glass and air) was taken as the cross-sectional profile of the image. The obtained profile is shown in FIG. 5.

The image of the cross section profile was cut in a view width of 1000 nm in the direction parallel to the glass surface, and a line (normal line k) vertical to the original unetched glass/air interface before etching was drawn. The position via which that normal line could be drawn to pass through at least one air layer m other than the air layer on the upper surface of the glass substrate was analyzed. However, in a case where the additional line could be drawn within a range of from a position of 25 nm on the left of that normal line to a position of 25 nm on the right of that normal line, then all those lines are counted as the same normal line. In this Example, the number of the normal lines drawn in the manner as above was 7.

Example 2

A glass substrate having an unleveled structure was obtained entirely in the same manner as in Example 1 except that the temperature of the glass substrate in Example 1 was changed to 560° C.

Example 3

A glass substrate having an unleveled structure was obtained entirely in the same manner as in Example 1 except that the temperature of the glass substrate in Example 1 was changed to 400° C.

Example 4

A glass substrate having an unleveled structure was obtained entirely in the same manner as in Example 1 except that the temperature of the glass substrate in Example 1 was changed to 620° C.

Example 5

A glass substrate having an unleveled structure was obtained entirely in the same manner as in Example 1 except that the HF flow rate in Example 1 was changed to 1.12 SLM.

Comparative Example 1

A glass substrate having an unleveled structure was obtained entirely in the same manner as in Example 1 except that the temperature of the glass substrate in Example 1 was changed to 350° C.

Example 6

Using the same injector 10 for use in atmospheric CVD method as in FIG. 1, gases were brought into contact with the surface of the glass substrate obtained in Example 5, in the manner as mentioned below. That is, a gas prepared by mixing 0.12 SLM of 30% $SiH_4$ and 9.4 SLM of nitrogen ($N_2$) was heated at 150° C. and sprayed onto the glass substrate at a flow rate of 64 cm/s through the center slit 1, while 3.6 SLM of oxygen ($O_2$) and 30.5 SLM of nitrogen ($N_2$) were sprayed thereonto through the outer slit 2, thereby forming a film containing $SiO_2$ as a main component in the concave and convex portions of the glass substrate having an unleveled structure. The gases run on/above the substrate 20 through the flow path 4, and via the exhaust slit 5, the gases are exhausted in an amount of 2 times the total flow amount of the sprayed gases. The glass substrate was heated at 525° C., and conveyed at a speed of 2 m/min. It is considered that the film containing $SiO_2$ as a main component could cover at least about 50% of the surface area of the concave and convex portions of the glass substrate having the unleveled structure.

Example 7

In the same manner as in Example 6, $SiO_2$ was formed on the glass substrate obtained in Example 1.

The treatment conditions in Examples and Comparative Example are shown in Table 1, and the data of the physical properties of the obtained glass substrates are shown in Table 2 and Table 3.

TABLE 1

| | Condition | | |
|---|---|---|---|
| | Temperature ° C. | HF vol % | $SiO_2$ Coating |
| Example 1 | 600 | 1 | no |
| Example 2 | 560 | 1 | no |
| Example 3 | 400 | 1 | no |
| Example 4 | 620 | 1 | no |
| Example 5 | 600 | 2 | no |
| Example 6 | 600 | 2 | yes |
| Example 7 | 600 | 1 | yes |
| Comparative Example 1 | 350 | 1 | no |

TABLE 2

| | Data of Physical Properties Measured through AFM | | | | | | | F/Si Composition | |
|---|---|---|---|---|---|---|---|---|---|
| | $θ_{50}$ (deg) | $θp$ (deg) | Rp nm | Ra nm | P-V nm | S-ratio | t nm | up to 5 nm from surface | depth 20 nm |
| Example 1 | 42 | 49 | 67 | 11 | 100.5 | 1.582 | 102 | 1.1 | |
| Example 2 | 42 | 51 | 118 | 18.4 | 161.6 | 1.661 | 120 | 3.6 | 2.1 |
| Example 3 | 22 | 23 | 37 | 2.7 | 49 | 1.12 | | | |
| Example 4 | 32 | 35 | 118 | 8.7 | 82.3 | 1.29 | 71 | 0.4 | 0.3 |
| Example 5 | 50 | 63 | 125 | 30.6 | 227.1 | 2.118 | 216 | | |
| Example 6 | 44 | 47 | 125 | 23.5 | 171.1 | 1.804 | 175 | 0 | |
| Example 7 | | | | 7.9 | 76.5 | 1.171 | 72 | 0 | |
| Comparative Example 1 | 18 | 17 | 36 | 1.9 | 32.7 | 1.083 | | | |

TABLE 3

| | Increase in Transmittance | | Durability Test | |
|---|---|---|---|---|
| | 400 to 1100 nm | 400 to 700 nm | Weather Resistance | Abrasion Resistance |
| Example 1 | 1.9% | 2.6% | −1.8% | −0.3% |
| Example 2 | 2.0% | 2.6% | | −0.7% |
| Example 3 | 1.1% | 1.6% | | |
| Example 4 | 1.1% | 1.5% | | |
| Example 5 | 3.2% | 3.6% | | −1.4% |
| Example 6 | 3.3% | 3.7% | | −0.5% |
| Example 7 | 1.2% | 1.6% | −0.5% | −0.1% |
| Comparative Example 1 | 0.4% | 0.5% | | |

The specific surface area of the untreated glass substrate and the glass substrates obtained in Examples 1 and 5 was measured in the manner mentioned below. The obtained results are shown in Table 4. It is found that the HF treatment markedly increased the specific surface area as measured according to the BET adsorption method using krypton gas.
(Specific Surface Area Measurement Method)
Apparatus: BELSORP-max, manufactured by BEL Japan Inc.
Measurement Method:

The glass substrate treated with HF was cut into strip shape each having a size of 25 mm×3 mm, followed by weighing them so as to be about 11 g. The weighed glass having the strip shape was put in a sample tube, followed by evacuating under the condition of 200° C. for 3 hours, and thereafter Kr (krypton) gas was adsorbed thereto at 77 K.

From the BET plot obtained from the adsorption isotherm, the Kr adsorption amount was obtained. From the thus-obtained Kr adsorption amount of the HF-treated substrate, the Kr adsorption amount of one side surface of the untreated substrate was subtracted to give the adsorption amount of the HF-treated surface of the treated substrate. Since the cut glass samples were nearly the same in mass, it was assumed that the untreated area of the three samples would be nearly the same. The relative specific surface area was calculated as the area change after HF treatment relative to the same area of the sample, based on the assumption that the area before HF treatment was 1.00.

TABLE 4

|  | Untreated | Example 1 | Example 5 |
|---|---|---|---|
| mass/g | 11.1111 | 11.0410 | 10.9288 |
| BET Multipoint Method/cm$^2 \cdot$ g$^{-1}$ | 22.6 | 30.4 | 42.1 |
| Treated Surface/cm$^2 \cdot$ g$^{-1}$ | 11.3 | 19.1 | 30.8 |
| Relative Specific Surface Area | 1.00 | 1.69 | 2.72 |

The present application is based upon a Japanese patent application filed on Apr. 15, 2011 (Japanese Patent Application No. 2011-091436) and a Japanese patent application filed on Apr. 27, 2011 (Japanese Patent Application No. 2011-099983), and the contents thereof are incorporated herein by reference.

INDUSTRIAL APPLICABILITY

According to the present invention, a glass substrate having an excellent anti-reflection effect can be obtained. Consequently, the surface-treated glass substrate obtained according to the present invention is widely used in various applications that require light transmittance therethrough, such as glass for building materials, glass for automobiles, glass for displays, optical elements, glass substrates for solar cells, glass for shop windows, optical glass, lenses for glasses, etc. In particular, the glass substrate can be used in the field of TCO substrates for thin-film silicon solar cells, cover glasses for crystalline silicon solar cells, displays, etc. Regarding the TCO substrates for thin-film silicon solar cells, tandem cell arrays are being promoted for efficiently utilizing sunlight. The quantum efficiency in an amorphous silicon layer is especially high for light falling in a wavelength range of from 400 to 700 nm, and the quantum efficiency in a microcrystalline silicon layer is especially high for light falling in a wavelength range of from 600 to 900 nm. Consequently, use of the glass substrate of the present invention enables efficient solar energy generation.

The abrasion resistance of the glass substrate of which the glass surface has been unleveled (roughened) is in a range with no problem in practical use, but the abrasion resistance of the glass substrate coated with SiO$_2$ is improved. Further, from the view point of weather resistance, those coated with SiO$_2$ change little, and are especially excellent in the case where the anti-reflection glass substrate is used outdoors.

EXPLANATION OF REFERENCE SIGNS

1: Center Slit
2: Outer Slit
4: Flow Path
5: Exhaust Slit
10: Injector
20: Glass Substrate
30: Convex Portion
31: Concave Portion
k: Normal Line
m: Air Layer
s: Untreated Glass Substrate Surface

The invention claimed is:

1. A glass substrate comprising a roughened surface, wherein:
   the roughened surface comprises multiple concave portions and multiple convex portions;
   the roughened surface has a structure such that, in at least three locations within an area of the roughened surface having a width of 1,000 nm, a line normal to the roughened surface would pass through a void between two glass regions;
   a surface roughness (Ra) of the roughened surface as defined in JIS B 0601 (1994) is 2 nm to 100 nm;
   a maximum height difference (P–V) of the roughened surface is 35 nm to 400 nm;
   an area ratio (S-ratio) of an area of concave portions to an area of convex portions in an inspection area is 1.1 to 3.0; and
   when the roughened surface is subjected to approximation through two-dimensional Fourier transformation in which each convex portion is approximated to a regular quadrangular pyramid, a length of one side of a base of the regular quadrangular pyramid is considered a size (R) of the convex portion, and a base angle of the convex portion in cross section is considered a tilt angle (θ) of the convex portion, in a frequency distribution:
   a maximum frequency of the size (Rp) of the convex portions is 37 nm to 200 nm;
   a maximum frequency of the tilt angle (θp) of the convex portions is 20° to 75°; and
   an absolute value of a difference between the maximum frequency of the tilt angle (θp) and 50% of a cumulative frequency distribution of the tilt angle (θ$_{50}$), (θp–θ$_{50}$), is 30° or less.

2. The glass substrate according to claim 1, wherein an atomic number concentration ratio of F/Si in the roughened surface is 0.05 or more to a depth of 5 nm.

3. The glass substrate according to claim 2, wherein the F/Si ratio continuously decreases from the roughened surface in a depth direction.

4. The glass substrate according to claim 1, wherein:
   the roughened surface has a relative specific surface area of 1.1 to 5.0;
   the relative specific surface area is a ratio of a specific surface area of the roughened surface to a specific surface area of a glass substrate that has not been roughened; and
   specific surface area is measured by a BET adsorption method using krypton gas.

5. The glass substrate according to claim 1, wherein at least 50% of the roughened surface is coated with a film comprising $SiO_2$ as a main component.

6. The glass substrate according to claim 1, further comprising a film comprising $SiO_2$ formed on at least one concave portion of the roughened surface.

7. The glass substrate according to claim 1, wherein the maximum frequency of the size (Rp) of the convex portions is 40 nm to 150 nm.

8. The glass substrate according to claim 1, wherein the maximum frequency of the size (Rp) of the convex portions is 60 nm to 130 nm.

9. The glass substrate according to claim 1, wherein the maximum frequency of the tilt angle ($\theta$p) of the convex portions is 20° to 70°.

10. The glass substrate according to claim 1, wherein the maximum frequency of the tilt angle ($\theta$p) of the convex portions is 25° to 70°.

11. The glass substrate according to claim 1, wherein the absolute value of the difference between the maximum frequency of the tilt angle ($\theta$p) and 50% of the cumulative frequency distribution of the tilt angle ($\theta_{50}$), ($\theta$p−$\theta_{50}$), is 20° or less.

12. The glass substrate according to claim 1, wherein the absolute value of the difference between the maximum frequency of the tilt angle ($\theta$p) and 50% of the cumulative frequency distribution of the tilt angle ($\theta_{50}$), ($\theta$p−$\theta_{50}$), is 13° or less.

13. The glass substrate according to claim 1, wherein the surface roughness (Ra) of the roughened surface is 2 nm to 70 nm.

14. The glass substrate according to claim 1, wherein the surface roughness (Ra) of the roughened surface is 2 nm to 50 nm.

15. The glass substrate according to claim 1, wherein the maximum height difference (P–V) of the roughened surface is 35 nm to 350 nm.

16. The glass substrate according to claim 1, wherein the maximum height difference (P–V) of the roughened surface is 35 nm to 200 nm.

17. The glass substrate according to claim 1, wherein the area ratio (S-ratio) of the area of concave portions to the area of convex portions in the inspection area is 1.1 to 2.7.

18. The glass substrate according to claim 1, wherein the area ratio (S-ratio) of the area of concave portions to the area of convex portions in the inspection area is 1.1 to 2.5.

19. The glass substrate according to claim 1, wherein:
the maximum frequency of the size (Rp) of the convex portions is 40 nm to 150 nm;
the maximum frequency of the tilt angle (Op) of the convex portions is 20° to 70°;
the absolute value of the difference between the maximum frequency of the tilt angle ($\theta$p) and 50% of the cumulative frequency distribution of the tilt angle ($\theta_{50}$), ($\theta$p−$\theta_{50}$), is 20° or less;
the surface roughness (Ra) of the roughened surface is 2 nm to 70 nm;
the maximum height difference (P–V) of the roughened surface is 35 nm to 350 nm; and
the area ratio (S-ratio) of the area of concave portions to the area of convex portions in the inspection area is 1.1 to 2.7.

20. The glass substrate according to claim 1, wherein:
the maximum frequency of the size (Rp) of the convex portions is 60 nm to 130 nm;
the maximum frequency of the tilt angle ($\theta$p) of the convex portions is 25° to 70°;
the absolute value of the difference between the maximum frequency of the tilt angle ($\theta$p) and 50% of the cumulative frequency distribution of the tilt angle ($\theta_{50}$), ($\theta$p−$\theta_{50}$), is 13° or less;
the surface roughness (Ra) of the roughened surface is 2 nm to 50 nm;
the maximum height difference (P–V) of the roughened surface is 35 nm to 200 nm; and
the area ratio (S-ratio) of the area of concave portions to the area of convex portions in the inspection area is 1.1 to 2.5.

* * * * *